(12) United States Patent
Bhat et al.

(10) Patent No.: US 8,344,526 B2
(45) Date of Patent: Jan. 1, 2013

(54) ENERGY GENERATING SUPPORTS

(76) Inventors: Nikhil Bhat, Fremont, CA (US); George Yoseung Choi, Menlo Park, CA (US)

( * ) Notice: Subject to any disclaimer, the term of this patent is extended or adjusted under 35 U.S.C. 154(b) by 505 days.

(21) Appl. No.: 12/730,922

(22) Filed: Mar. 24, 2010

(65) Prior Publication Data

US 2010/0244457 A1    Sep. 30, 2010

Related U.S. Application Data

(60) Provisional application No. 61/163,344, filed on Mar. 25, 2009.

(51) Int. Cl.
F03G 7/00    (2006.01)
(52) U.S. Cl. ........................... 290/1 R; 290/1 A
(58) Field of Classification Search ............... 290/1 A, 290/1 R
See application file for complete search history.

(56) References Cited

U.S. PATENT DOCUMENTS

| | | |
|---|---|---|
| 3,387,856 A | 6/1968 | Guilhamat et al. |
| 3,885,235 A | 5/1975 | Bergstrom et al. |
| 5,400,012 A | 3/1995 | Walton |
| 5,435,317 A | 7/1995 | McMahon et al. |
| 5,479,932 A | 1/1996 | Higgins et al. |
| 5,505,199 A | 4/1996 | Kim |
| 5,515,865 A | 5/1996 | Scanlon |
| 5,544,649 A | 8/1996 | David et al. |
| 5,864,291 A | 1/1999 | Walton |
| 5,914,660 A | 6/1999 | Mesibov et al. |
| 6,028,515 A | 2/2000 | Eisinger |
| 6,054,926 A | 4/2000 | Deleo |
| 6,150,941 A | 11/2000 | Geiger et al. |
| 6,475,639 B2 | 11/2002 | Shahinpoor et al. |
| 6,513,362 B1 | 2/2003 | Yadav et al. |
| 6,611,783 B2 | 8/2003 | Kelly, Jr. et al. |
| 6,753,782 B2 | 6/2004 | Power et al. |
| 6,765,489 B1 | 7/2004 | Ketelhohn et al. |
| 6,768,246 B2 | 7/2004 | Pelrine et al. |
| 6,816,603 B2 | 11/2004 | David et al. |
| 6,882,086 B2 | 4/2005 | Kornblush et al. |
| 7,196,688 B2 | 3/2007 | Schena |
| 8,253,281 B2 * | 8/2012 | Namuduri et al. ............ 310/23 |
| 2002/0097155 A1 | 7/2002 | Cassel et al. |
| 2003/0121294 A1 | 7/2003 | Ryu et al. |
| 2005/0210592 A1 | 9/2005 | Littlehorn et al. |

(Continued)

FOREIGN PATENT DOCUMENTS

GB    2192460 A    1/1988

(Continued)

OTHER PUBLICATIONS

Ando et al., "A bio-inspired device to detect equilibrium variations using IPMCs and ferrofluids," *Sensors and Actuators A: Physical*, vol. 144, pp. 242-250, 2008, Elsevier B.V.

(Continued)

*Primary Examiner* — Tho D Ta
(74) *Attorney, Agent, or Firm* — Levine Bagade Han LLP

(57) ABSTRACT

Energy harvesting systems are described in which electroactive materials, such as dielectric elastomers, may be utilized to absorb the shocks, bumps, and vibrations from the road or path to generate energy which is captured and stored for use in the vehicle to provide additional power for any number of uses. Other devices and systems, such as household appliances which dissipate vibrational energy, may also incorporate any number of the dielectric elastomer generators.

52 Claims, 8 Drawing Sheets

U.S. PATENT DOCUMENTS

| | | | |
|---|---|---|---|
| 2006/0087325 A1 | 4/2006 | Aria et al. | |
| 2006/0122544 A1 | 6/2006 | Ciluffo | |
| 2006/0145495 A1 | 7/2006 | Fang et al. | |
| 2006/0185680 A1 | 8/2006 | Bhat et al. | |
| 2006/0219506 A1 | 10/2006 | Zdeb | |
| 2006/0258916 A1 | 11/2006 | Pietersen | |
| 2007/0008154 A1 | 1/2007 | Albert | |
| 2007/0076935 A1 | 4/2007 | Jeung et al. | |
| 2007/0089950 A1 | 4/2007 | Kim | |
| 2007/0132558 A1 | 6/2007 | Rowe et al. | |
| 2007/0156060 A1 | 7/2007 | Cervantes | |
| 2007/0157293 A1 | 7/2007 | Shuster | |
| 2007/0241911 A1 | 10/2007 | Swan et al. | |
| 2007/0257491 A1* | 11/2007 | Kornbluh et al. | 290/53 |
| 2007/0287394 A1 | 12/2007 | Swan et al. | |
| 2008/0034749 A1 | 2/2008 | Ukpai et al. | |
| 2008/0058742 A1 | 3/2008 | Ales | |
| 2008/0091082 A1 | 4/2008 | Lu | |
| 2008/0091122 A1 | 4/2008 | Dunlop | |
| 2008/0139899 A1 | 6/2008 | Student et al. | |
| 2008/0146958 A1 | 6/2008 | Guillory et al. | |
| 2008/0183095 A1 | 7/2008 | Austin et al. | |
| 2009/0054877 A1 | 2/2009 | Hood et al. | |
| 2010/0055378 A1 | 3/2010 | Kim et al. | |
| 2011/0032103 A1 | 2/2011 | Bhat et al. | |

FOREIGN PATENT DOCUMENTS

| | | |
|---|---|---|
| WO | WO 2005/011491 | 2/2005 |

OTHER PUBLICATIONS

Anton et al. "Towards a biomimetic EAP robot," *Proc of TAROS*, 7 pages, 2004, accessed online at http://citeseerx.ist.psu.edu/viewdoc/download?doi=10.1.1.153.2776&rep=rep1&type=pdf.

Bar-Cohen, Y., "1st Wrestling Match between Human and EAP Actuated Robotic Arms was Held on Mar. 7, 2005 in San Diego, CA," *WorldWide ElectroActive Polymers EAP (Artificial Muscles) Newsletter*, vol. 7:1, 26 pages, Jun. 2005, Pasadena, California, US.

Bar-Cohen, Y., "Biomimetics: mimicking and inspired-by biology," *Proceedings of the SPIE Smart Structures Conference*, vol. 5759-02, 8 pages, Mar. 7-10, 2005, Jet Propulsion Lab, California Institute of Technology, San Diego, California, USA.

BIOREC, BioMatt® Monitoring System, Atomitie 5 B, P.O. Box 85, FIN-00371, Helsinki, http://www.biorec.fi/proda.htm, 7 pages, accessed online on Dec. 21, 2009.

Bonomo et al., "A method to characterize the deformation of an IPMC sensing membrane," *Sensors and Actuators A*, vols. 123-124, pp. 146-154, 9 pages, Sep. 23, 2005, Catania, Italy.

Bonomo et al., "A model for ionic polymer metal composites as sensors," *Smart Materials and Structures*, vol. 15, pp. 749-758, Feb. 16, 2006, Institute of Physics Publishing, Catania, Italy.

Bonomo et al., "A resonant force sensor based on ionic polymer metal composites," *Smart Materials and Structures*, vol. 17, pp. 1-13, 2008, IOP Publishing, Ltd.

Bonomo et al., "A Sensor-Actuator Integrated System Based on IPMC's," *Proceedings of IEEE*, vol. 1, pp. 489-492, Oct. 2004, Catania, Italy.

Bonomo et al., "Improved Frequency Investigation of IPMC Based on Sensors," Instrumentation and Measurement Technology Conference (IMTC), *Proceedings of IEEE*, pp. 2338-2341, Apr. 24-27 2006, Sorrento, Italy.

Bonomo et al., "Motion Sensors and Actuators Based on Ionic Polymer-Metal Composites," *Device Applications of Nonlinear Dynamics, Understanding Complex Systems*, pp. 83-99, 2006.

Copley et al., "The Effect of Viscosity and Ion Size on the Transduction of Ionic Polymer Metal Composite Actuators," *Virginia Polytechnic Institute and State University*, pp. 23-28, 2005, Blacksburg, Virginia, USA.

Freescale Semiconductor, pamphlet, MC1320x 2.4 GHz RF Transceiver, Document No. MC132OX24GZFS, 2 pages, 2005.

G-Link 2.4 GHz Wireless Accelerometer Node, Technical Product Overview, MicroStrain, 2 pages, 2006, Willston, Vermont, USA.

Mallavarapu, K., "Feedback Control of Ionic Polymer Actuators," Thesis submitted to the Faculty of the Virginia Polytechnic Institute and State University, 96 pages, Jul. 2001, Blacksburg, Virginia, USA.

Mortola et al., "Dynamics of breathing infants," *Journal of Applied Physiology*, vol. 52:5, pp. 1209-1215, 1982, American Physiological Society.

Mudarri, T., "A Novel Use for Ionic Polymer Transducers for Ionic Sensing in Liquid," Thesis submitted to the Faculty of the Virginia Polytechnic Institute and State University, 96 pages, Dec. 18, 2003, Blacksburg, Virginia, USA.

Nemat-Nasser et al., "Tailoring actuation of ionic polymer-metal composites through cation combination," *Electroactive polymer actuators and devices (EAPAD)*, vol. 5051, pp. 245-253, 2003, Conference, Univeristy of San Diego, accessed online at http://www-.

Nemat-Nasser et al., "Tailoring the actuation of ionic polymer-metal composites," *Smart Material and Structures*, vol. 15, pp. 909-923, Mar. 3, 2006, Institute of Physics Publishing, La Jolla, CA.

Newbury, K., "Characterization, Modeling, and Control of Ionic Polymer Transducers," Dissertation submitted to the Faculty of the Virginia Polytechnic Institute and State University, 153 pages, Sep. 2002, Blacksburg, Virginia, USA.

PCT International Patent Application No. PCT/US2010/028484 filed Mar. 24, 2010 in the name of Bhat, International Search Report and Written Opinion mailed May 18, 2010.

Punning et al., "A self-sensing ion conducting polymer metal composite (IPMC) actuator," *Sensors and Actuators A*, vol. 136, pp. 656-664, 2007, Elsevier B.V.

Tadokoro et al., "Soft Micromanipulation Device with Multiple Degrees of Freedom Consisting of High Polymer Gel Actuators," *Micro Electro Mechanical Systems*, pp. 37-42, Jan. 1999.

Tanikawa et al., "Development of a micro-manipulation system having a two-fingered micro-hand," *IEEE Transactions on robotics and automation*, vol. 15:1, pp. 152-162, Feb. 1999.

* cited by examiner ial energy.
ENERGY GENERATING SUPPORTS

CROSS-REFERENCE TO RELATED APPLICATIONS

This application claims the benefit of priority to U.S. Prov. App. 61/163,344 filed Mar. 25, 2009, which is incorporated herein by reference in its entirety.

FIELD OF THE INVENTION

The present invention relates to systems and methods for harvesting energy from any vehicle, particularly automobiles and any other vibrating industrial and household appliance. More particularly, the present invention relates to systems and methods for harvesting energy from the suspension or shock absorbing system of the vehicle.

BACKGROUND OF THE INVENTION

Vehicle suspension systems give passengers a comfortable ride typically by supporting the vehicle and responding to road bumps, road irregularities by moving up and down. But these motions induce undue oscillations or vibrations and a damper or shock absorber is used to dampen out the vibrations. Typical shock absorbers function by dissipating or absorbing the unwanted energy.

There are several types of shock absorbers. Some work on hydraulics while others work on pneumatic or eddy current types of damping. Pneumatic shock absorbers convert kinetic energy from road bumps or vibrations into heat by heating the surrounding air while hydraulic type shock absorbers function similarly by converting the kinetic energy into heat for absorption by a fluid, such as oil.

Vehicle efficiency can be increased if this wasted energy can be harvested and converted into useful energy. With the advent of gas-electric hybrids and electric vehicles any regenerative energy which can be harvested from a car can extend the range of the car for a given battery charge. Some literature indicates that about 15% of energy generated by a vehicle is wasted due to damping.

Dampers are also used in vehicles in other locations such as in the engine mounts and/or seat mounts. In electric vehicles and hybrid vehicles dampers are also used in battery mounts. All these different types of dampers convert vibrational energy into heat or other kinds of wasted energy.

As a vehicle travels, energy in the form of bumps or shocks is typically generated as the suspension system absorbs such energy from the interface against the road; however, such energy is usually dissipated quickly. Harnessing this wasted energy by converting it into useful electrical energy is a way to improve the efficiency of the vehicles. Power generation from dampers has not been significantly developed or explored. Conventional devices typically suffer from practical limitations. For example, U.S. Pat. Nos. 4,500,827; 5,578,877; and 5,347,186 all describe different embodiments of electromagnetic linear generators which convert road vibration energy into electrical energy by using the principle of electromagnetism. Another example is described in U.S. Pat. No. 6,952,060 which discloses an electromagnetic linear generator which converts the road vibrational energy into electrical energy from the relative motion of an assembly of coil windings array and magnet array. U.S. Pat. No. 6,920,951 describes a power screw type of regenerative damper which uses a rotor and a stator. Yet another example is shown in U.S. Pat. App. 2009/0260935 A1 which discloses a regenerative shock absorber which compresses a hydraulic fluid in a cylinder by a piston which moves corresponding to the road vibration. The fluid then passes through a hydraulic motor which converts rotary motion of the shaft into electrical energy. This device also uses electric generators such as permanent magnet systems for converting the rotary motion into useful electrical energy.

However, conventional devices usually add to the weight of the vehicle and may negatively influence any gains in energy efficiency and may also potentially increase the cost of the vehicle. Dielectric elastomer materials are transducers which can be used in both actuation mode and energy generation mode. In U.S. Pat. App. 2007/0257491 A 1, marine devices which can convert the mechanical energy present in waves into electrical energy are described. Dielectric elastomer generators are used. In U.S. Pat. No. 6,768,246, designs and methods for converting energy generated from biologically-derived activities such as walking, running, etc. into electrical energy using dielectric elastomer generators are described. However, application of dielectric elastomer based devices for energy generation from automotive sources and other industrial and household sources has not been explored significantly. All patents and patent applications described herein are incorporated herein by reference in their entirety.

SUMMARY OF THE INVENTION

Energy generating dampers are described which may be used in applications where vibrational energy is present, such as vehicles or in other household and industrial appliances. These dampers are configured to convert mechanical vibrations such as those generated in response to road bumps, surface irregularities, engine vibrations, or any other similar kind of vibrations into useful electrical energy.

Generally, an energy generating damper may be configured as a support member comprising, e.g., a first chamber, a second chamber operatively movable relative to the first chamber, one or more layers of a dielectric elastomer positioned within the second chamber, and, a compression member attached to the first chamber and in communication with the one or more layers in the second chamber, where movement between the first chamber and second chamber urges the compression member to change a pressure imparted upon or against the one or more layers such that the one or more layers generate an electric discharge in response to the change in pressure.

In one example, the energy generating damper may be configured as a shock absorber for use in vehicles. This shock absorber may comprise at least two chambers which move relative to each other. One of the chambers may enclose one or more stacks of dielectric elastomer type generators. These individual dielectric elastomer units can be in different shapes such as disc, rolls, tubes, etc. A first end of this shock absorber may be connected to the frame of the vehicle while the other end is connected to the vibrating element such as the axle. As the vehicle travels, the translational movement (e.g., up and down motion) generated by the vehicle may causes a plunger connected to one of the chambers to move against or upon the stacked dielectric elastomer generators which may cause stretching and contracting/relaxing of the dielectric elastomer which in turn causes electrical energy to be generated.

Another example of the shock absorber may comprise at least two chambers which move relative to each other such that a piston attached to one of the chambers may translate (e.g., move up and down) in the second chamber. A fixed volume of viscous fluid such as oil or water may be disposed in the second chamber. The walls of the chamber may be lined by layers of the electroactive polymer material, e.g., dielectric elastomer, hence creating a compliant housing. This shock absorber may be connected in the vehicle such that when the vehicle is moving the mechanical vibrations generated in response to bumps, road surface irregularities, and other projections cause the piston to move up and down. This oscillatory and linear movement of the piston may pressurize and de-pressurize the fixed volume of the viscous fluid present in the chamber such that the oscillatory change in the pressure causes the compliant housing to expand and contract/relax cyclically which in turn causes the electroactive polymer material to stretch and contract/relax cyclically and generate useful electrical energy for harvesting and/or storing.

In another example, a shock absorber having at least two chambers which may move relative to each other may utilize a piston attached to one of the chambers which may move (e.g., up and down) in the second chamber. The piston may be comprised of a fixed non-compressible rod which is connected to a first generator element. The first generator element may in-turn be connected to a second generator element with a biasing element, such as a compression spring. Each following generator element may be connected to the adjacent previous one with a biasing element such as a compression spring. The numbers of generator elements can range from one or more depending on the size of the generators and also the energy requirements. As the vehicle moves, the generated vibrations causes the piston to move, e.g., up and down, such that the biasing elements may compress and expand. The biasing elements may amplify some of the vibration signals which in turn causes each generator element to stretch and compress in a controlled manner and controlled stretching and compression of the generator element causes the generation of useful electrical energy.

In another example, a supplementary energy generation module can be incorporated into a conventional shock absorber. The module may be cylindrical in shape and may be placed between the connection and one of chambers of the shock absorber or it can be placed on the outside of an existing shock absorber between the two chambers or members which move relative to each other. Moreover, the module may incorporate the dielectric elastomer generators in various shapes, e.g., discs, rolls, etc. Because of the relative motion of the shock absorber, the dielectric energy generators undergoing stretching and compression leads to the generation of useful electrical energy.

In another example, the above-mentioned energy generating shock absorber designs can be scaled up or down in size and configured to be used in household appliances and other industrial applications. For example, in a typical household washer and dryer based on the washing and drying load the rotating drum can rotate off-axis. This kind of motion of the drum introduces unwanted mechanical vibrations in the system. The above mentioned shock absorbers can be used in the washing and drying machines by connecting them between the rotating drum and the stationary body and converting the mechanical energy into useful electrical energy.

In another example, the dielectric elastomer generators may be used as an energy generating engine mount which has a housing assembly containing layers of dielectric elastomer material. This material may be stacked one above the other in a first chamber and with the remaining chamber filled with a viscous fluid, such as oil or water, under pressure. An impermeable elastic membrane may separate the layers of electroactive polymers from the fluid region. A cover with a central opening may be placed on top of the housing with a piston of a plunger passed through the opening and sealed against the opening with seals such that the piston is able to move up and down relative to the housing assembly. The piston may have a disc type distal end with the diameter of the disc equal to or slightly less than the internal diameter of the housing. The proximal end of the piston or plunger may have a connector which couples the engine mount to the vibrating engine. The housing assembly may have a connector which also couples the housing to the vehicle. Under operation of the vehicle, as the engine starts vibrating the vibrations are converted into linear oscillatory vertical motions which are transmitted to the plunger assembly. This forces the plunger to moves up and down causing the fluid to be pressurized and de pressurized. This change in the fluid pressure may effectively cause the electroactive polymer material to stretch and compress leading to the generation of useful electrical energy.

In another example, an engine mount may utilize a housing containing a damping fluid such as oil. A flexible cap comprised of, e.g., alternating layers of rubber and electroactive polymers, may be used to enclose the housing while remaining flexible. This cap may also have a centrally mounted plunger or connector which is tightly fined through the flexible cap. The connector may be coupled to the engine while the housing is coupled to the car body such that as the car moves, the engine vibrations cause the flexible cap to move up and down causing the electroactive polymer elements to stretch and relax leading to the generation of useful electrical energy. These and other types of mounts may be utilized for battery mounting, e.g., in electric, plug-in hybrid and hybrid vehicles. Additionally and/or alternatively, these mounts may be utilized in other places in an automobile such as under the seats, etc.

In use, a vehicle may be mounted with several of these generators. For example, a car can have four energy-generating shock absorbers and three or more engine mounts. The electrical energy generated from each of the generators may be transferred to a centrally located unit, such as a step-down transformer, which may step the voltage to a level suitable for a battery voltage such that the harvested energy may be stored for future use. A centralized electronic control unit may control the entire system.

DETAILED DESCRIPTION OF THE INVENTION

Figure 1A:
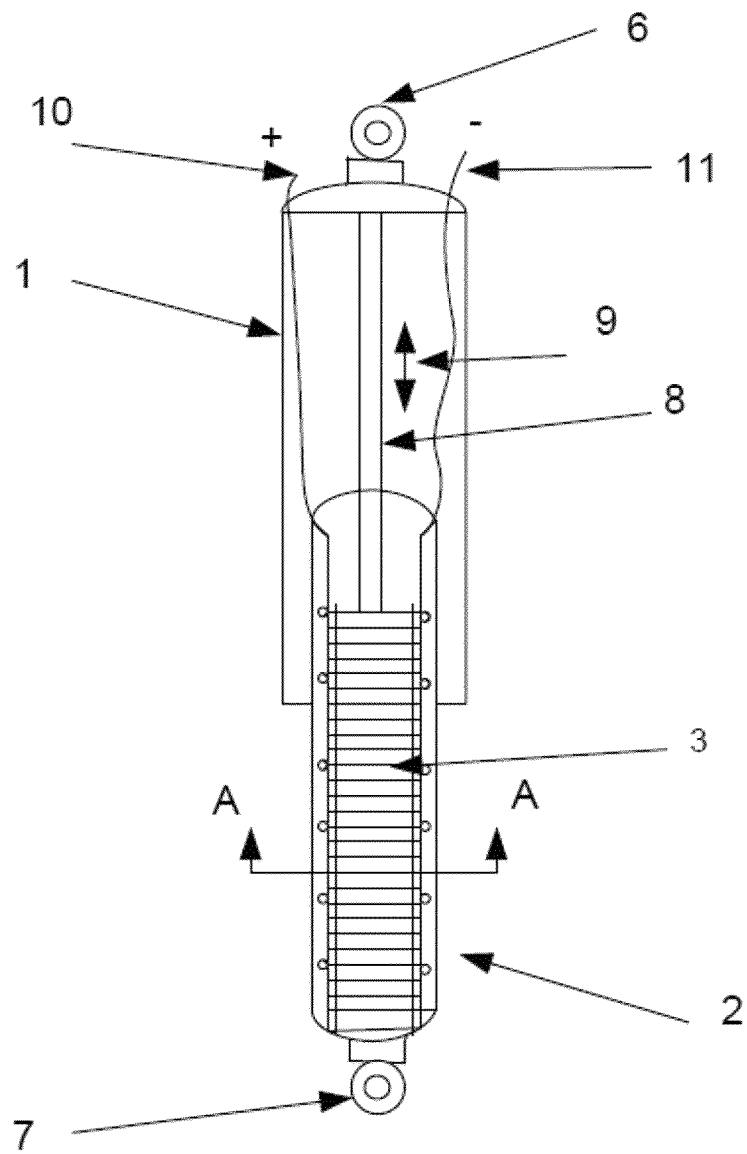
FIGS. 1A and 1B show partial cross-sectional side and cross-sectional end views, respectively, of one example of an active damping and energy harvesting shock absorber system.

Improving vehicle energy efficiency is desirable with hybrid and electrical vehicle technology more commonplace. With road surfaces uneven and full of bumps, one method for improving vehicle efficiency is by capturing energy which is normally lost through heat, noise, vibrations, etc., as vehicles travel over these roads. The average bump height along an average road can vary from 2 mm to 6 mm while the frequency of the bumps can vary from $1/10$ to $1/100$ cm$^{-1}$.

Dielectric elastomers, which are a type of electroactive polymers, may be used to capture and convert these vibrations from, e.g., the wheels, engine, seats, etc., for energy generation as the vehicle is in use. The types of engines may vary from internal combustion to electric engines or any other type of engine which may be used by any type of vehicle. Generally, dielectric elastomer generators comprise soft stretchable polymer materials such as acrylic, silicone rubber, polyurethane, etc., which may be placed between two compliant electrodes and operate on the principle of variable capacitance. Typically, a bias voltage ranging from hundreds of volts to 5 kV to 10 kV may be applied to a dielectric elastomer film. Under the bias voltage when the elastomer is stretched, electrical charges are introduced onto the compliant electrodes. When the film is allowed to relax, these introduced charges converge while the distance between opposite charges is increased due to the thickness of the film increasing. This causes an effective increase in the electrical voltage of the charge and the increased electrical energy can be harnessed as useful electrical energy. (See, e.g., "Dielectric elastomers: Generator mode fundamentals and applications", Smart Structures and Materials 2001: EPAD, Proceedings of SPIE Vol. 4329.) These dielectric elastomer generators can be configured into several ways such as square films, discs, rolls, tubes, stacks, etc.

The use of one or more dielectric elastomer generators in a vehicle may produce energy by harvesting the vibrational motion imparted by the road, engine, and/or other components to the vehicle sufficient to use and/or storage. For example, a typical vehicle which weighs approximately 1135 kg (2500 pounds) may have a vehicle weight distribution per shock absorber of, e.g., 283.5 kg per shock absorber. Assuming an average speed of a car to be 45 miles/hr and the bump spatial frequency to be $1/100$ cm$^{-1}$, the bump occurrence frequency can be calculated at 20 Hz. (For calculation purposes we assume the average bump height to be 2 mm.) Dielectric elastomeric generators, depending on their construction, base polymeric material, and electrode geometry can have varying energy densities. In this example, a dielectric elastomer may have an energy density of 0.4 J/gram which is estimated at 100% strain. However, a dielectric elastomer having a reasonably high fatigue life of, e.g., 10% strain, may be utilized. To achieve a 2 mm displacement at 10% strain, the length of the dielectric material is around 20 mm. If a total of 4 kg of dielectric material can be used to create the energy generating shock absorbers, at 50% efficiency (assuming 30% of the energy is used for damping purposes while 20% is lost) 80 Joules of energy can be generated for every bump and at a 20 Hz bump frequency, a total of 1.6 kWhr of power may be produced. This example is intended to be illustrative and not limiting. The total amount of energy generated by the devices described herein may be varied, of course, depending upon the various parameters noted.

Figure 1B:
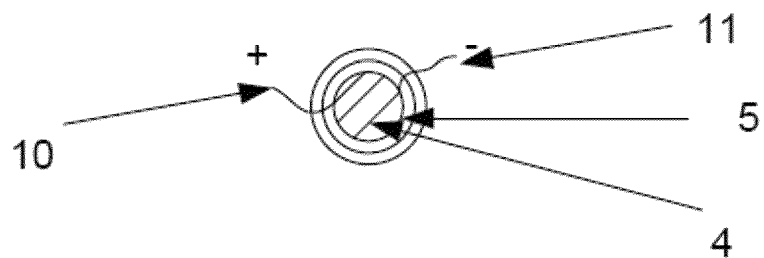

Turning now to FIGS. 1A and 1B, which show partial cross-sectional side and cross-sectional end views, respectively, of one embodiment. As shown, a shock absorber having a first chamber 1 and second chamber 2 which are translatably moveable relative to one other, e.g., in an up and down motion, may comprise a stack 3 of one or more dielectric elastomer type generators contained within second chamber 2. Each of the one or more individual dielectric elastomer units 4 can be configured in a number of different shapes such as a diaphragm, disc, rolls, square shapes, etc. In this particular embodiment, diaphragm-type generator elements are shown. As seen in FIG. 1B, each of the diaphragm-type dielectric elastomeric generator elements 4 may be supported by a frame 5 which secures the element position within chamber 2 and relative to each element 4.

A proximal end of the shock absorber enclosing chamber 1 may be coupled to, e.g., the frame of the vehicle, with the connecting element 6 while the distal end may be coupled to, the axle of the vehicle, with the connecting element 7. A plunger 8 which is connected to the chamber 1 and passes through chamber 1 and into chamber 2 can vibrate and/or move up and down, as shown by arrow 9, as the axle and wheels move relative to the vehicle frame in response to bumps and projections along the road. Wires or conductors 10 and 11 are connected electrically to the dielectric elastomer generator stack 3 and may be used for transmission of any electrical energy conducted to and/or generated from the shock absorbers. A bias voltage of, e.g., 0.1 kV to 10 kV, may be applied to the generator stack 3 through the wires 10 and 11.

A distal end of the plunger 8 which passes through chamber 1 may rest in contact with or against the generator stack 3 such that the vibrational motion imparted to the shock absorber causes the chambers 1, 2 to move relative to one another and the plunger 8 to move against or compress the stacked dielectric elastomer generators 3. This constant oscillatory motion may cause the alternative stretching and contracting/relaxing of the dielectric generator elements 4. During the contracting/relaxing stage, the mechanical strain is converted into electrical energy by increase in voltage of the applied charge. Additionally and/or alternatively, while the function of a shock absorber is to dampen the vibrations in order to provide a smooth ride to the passengers, the dielectric generators 4 may be used in an actuator mode during alternating cycles to also achieve active dampening of the vibrations by modulating the amplitude of electrical input to the dielectric generators 4 using, e.g., a controller in electrical communication with the generator stack 3.

Figure 1C:
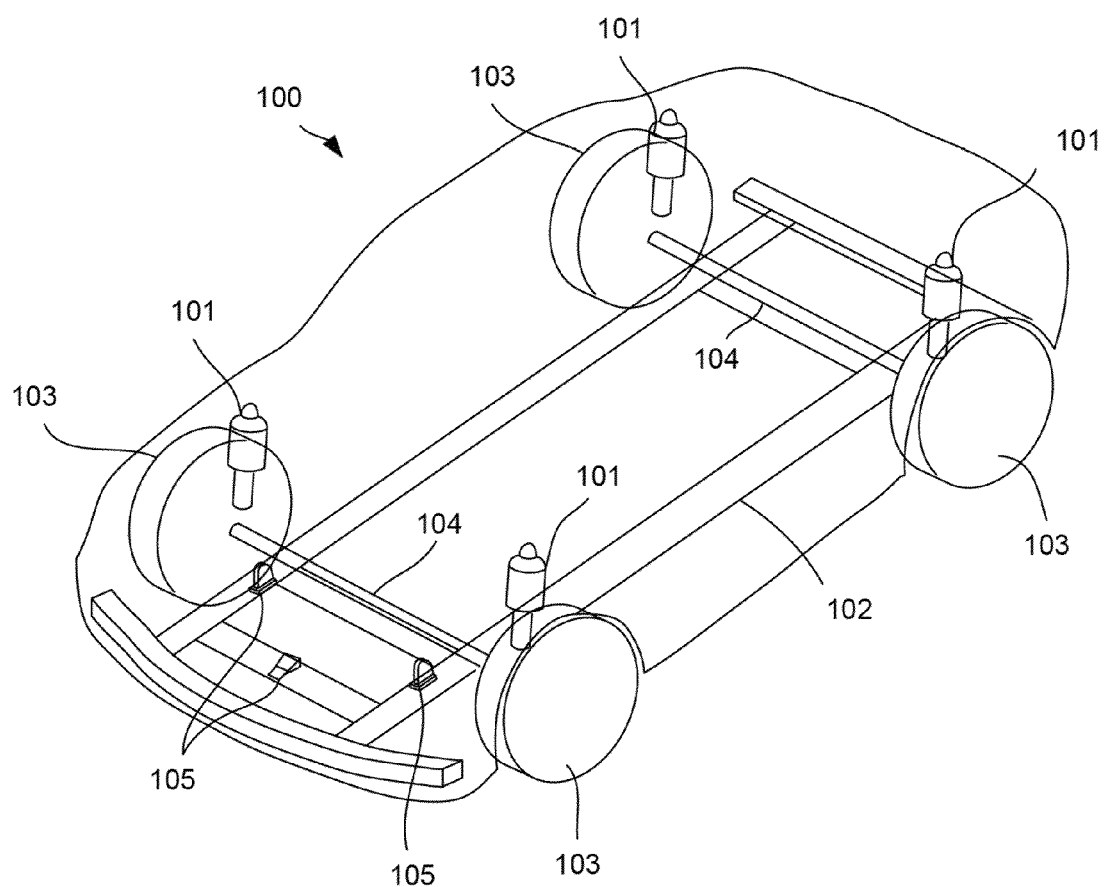
FIG. 1C shows a perspective view of shock absorber placement within a vehicle for energy harvesting.

FIG. 1C shows a perspective view of a typical vehicle 100 and the relative positioning of the one or more shock absorbers 101 incorporating the dielectric elastomer generators. As illustrated, the shock absorbers 101 may be coupled to a frame 102 of the vehicle 101 as well as to the wheels 103 or axle 104 for receiving the vibrations. Also shown are examples of at least three engine mounts 105 which may be used for mounting a mass such as the engine (not shown for clarity) to the vehicle. The engine mounts 105 may be used with internal combustion engines, electric motors, rotary or linear vibrating actuators, or any other engine or component which generates vibrations or which transmits movement or vibrations in response to road conditions. Such mounts may also be used for mounting other masses within or upon the vehicle, such as the battery which may vibrate and move in response to the vehicle movement. Engine mounts and/or battery mounts incorporating dielectric elastomers are described in further detail herein.

Figure 2:
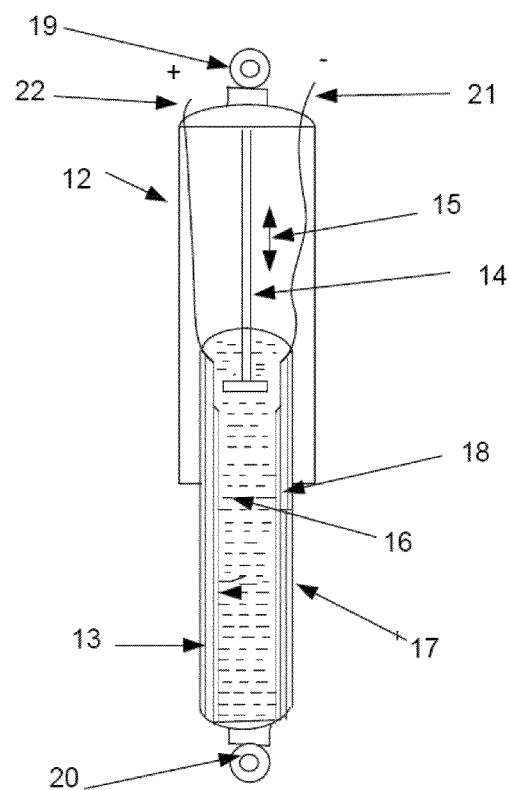
FIG. 2 shows a partial cross-sectional side view of another example of an active damping and energy harvesting shock absorber system using an incompressible fluid.

FIG. 2 shows a different embodiment of the shock absorber having a first chamber 12 and a second chamber 13 which can move relative to each other. A piston 14 is attached to chamber 12 is translatable within the second chamber 13, as shown by the arrow 15, as the two chambers move relative to one another. A fixed volume of viscous fluid 16 (e.g., oil, water, etc.) may be contained within the second chamber 13 in a fluid-tight manner. The interior walls 17 of the second chamber 13 may be lined by one or more layers of the dielectric elastomer material 18 creating a compliant housing. In an alternative variation, a gap may be present between the wall 17 and one or more layers of dielectric elastomer material 18. The proximal end of first chamber 12 may be coupled to the frame of the vehicle by a connector 19 while the distal end of chamber 13 may be coupled to the axle of the vehicle by a connector 20. Wires or conductors 21 and 22 may provide electrical connections between the dielectric elastomer generators 18 and the vehicle. A bias voltage of e.g., 0.1 kV to 10 kV, may be applied by the wires 21 and 22 to the dielectric elastomer generators 18.

When the vehicle is moving the mechanical vibrations are generated due to bumps, road surface irregularities, etc., the two chambers 12 and 13 may move relative to each other causing piston 14 to vibrate or move within the fluid 14 contained within second chamber 13. This oscillatory and linear movement of the piston 14 may alternately pressurize and de-pressurize the viscous fluid 16 present in the chamber 13 and subsequently cause the dielectric elastomer material 18 to stretch and contract/relax cyclically which in turn leads to generation of useful electrical energy, which may be transmitted through wires 21, 22. The movement of the piston 14 in the viscous fluid 16 may also provides the damping energy to reduce or mitigate the vibrations.

Figure 3:
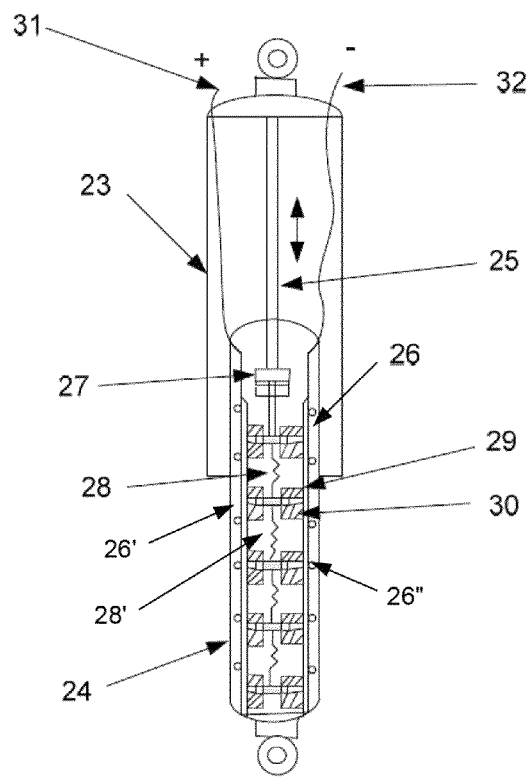
FIG. 3 shows a partial cross-sectional side view of another example of active damping and energy harvesting shock absorber system using one or more connected biasing elements.

FIG. 3 shows yet another example in the partial cross-sectional view of a shock absorber having a first chamber 23 and a second chamber 24 which may move relative to each other. A piston 25 attached to first chamber 23 may move accordingly within the second chamber 24 and may comprise a fixed non-compressible rod which is connected to a first generator 26 within second chamber 24 via a connector 27. The first generator element 26 is in turn electrically connected to a second generator element 26' with a biasing element, such as a compression spring 28. Each generator element may comprise two or more elements, e.g., top generator element 29 and bottom generator element 30, where each generator element defines an opening therethrough to allow for the passage of spring 28 to an adjacent generator element.

Each of the generators 26 may connected to an adjacent previous one with a compression spring 28. For instance, first generator element 26 may be coupled to second generator element 26' via first spring 28, second generator element 26' may be coupled to a third generator element 26" via second spring 28' and so on. The numbers of generators can vary depending on the size of the generators and also the energy requirements. Wires or conductors 31 and 32 may provide electrical connections to the dielectric elastomeric generators. In this embodiment when the vehicle is moving, the road vibrations and irregularities causes the piston 25 to move up and down thus causing each of the springs 28 to compress and expand in response. These springs may help in amplifying some of the vibration signal which in turn may cause each generator to stretch and compress in a controlled manner. This controlled stretching and compression of the generator may cause the generation of useful electrical energy. Moreover, the dielectric generators may also be used in an actuator mode during alternating cycles by modulating the electrical input to the generators to achieve damping forces to help in achieving active damping of the vibrations.

Figure 4:
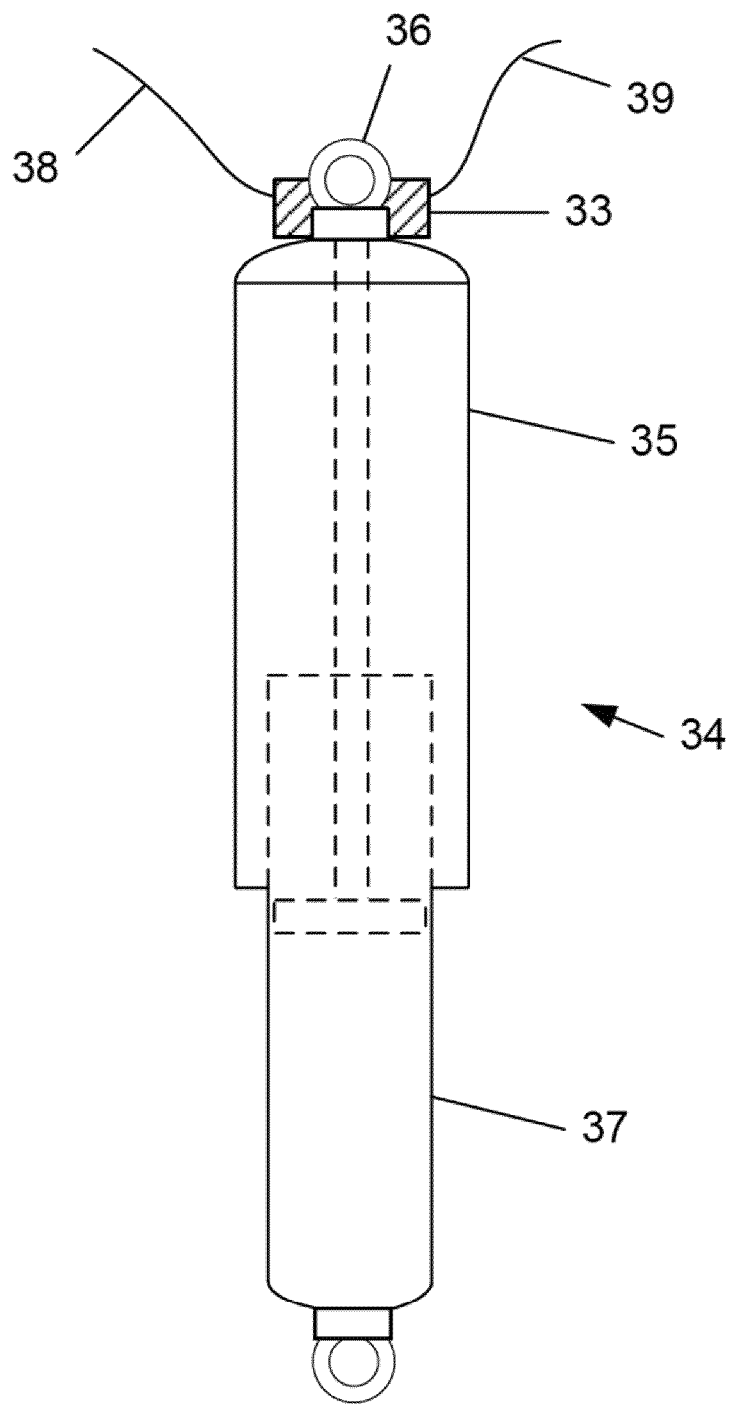
FIG. 4 shows a partial cross-sectional side view of another example of a conventional shock absorber incorporating an energy generating mount attached.

FIG. 4 shows yet another embodiment where a dielectric generator module 33 may be incorporated as a supplementary device to a conventional shock absorber 34, e.g., an oil-type shock absorber where damping is provided by the viscous drag provided by the oil. Module 33 can be cylindrical in shape and it can be placed between the connection 36 of the chamber 35 or it can be placed on the exterior of shock absorber 34 such that a first end of the generator module 33 is coupled to chamber 35 while a second end is coupled to chamber 37 of shock absorber 34. The generator module 33 can have the dielectric elastomer material incorporated in any of the configurations described herein, e.g., stack, roll, tube, disc configuration, etc. Likewise, wires or conductors 38 and 39 may provide electrical connections to the dielectric generator module 33. A bias voltage of, e.g., 0.1 kV to 10 kV, may also be applied to the dielectric elastomer generator 33 through the wires 38 and 39. As the vehicle moves, the vibrations generated in response to road bumps and irregularities may cause the two chambers 35 and 37 of the shock absorber 34 to move relative to each other thereby causing the dielectric elastomer generator 33 to stretch and/or contract/relax and produce electrical energy while the damping function is provided by the shock absorber 34.

In addition to the vibration generated in response to road surface irregularities, engine vibrations are another source of vibrational energy typically dissipated as lost energy. Auto engines typically vibrate at a frequencies ranging from, e.g., 1 Hz to 500 Hz, and the amplitude of engine vibrations can vary from, e.g., 0.05 mm to 3 mm. Typically a car has three engine mounts where the average diameter of an engine mount is about 5 inches and the average height is about 4.5 inches with the average load rating of an engine mount varying from, e.g., 200 to 400 pounds. An example for using dielectric elastomer generators in generating energy from vibrations imparted to engine mounts may assume an average amplitude of engine vibration to be, e.g., about 1 mm at a frequency of 100 Hz. The energy density of a typical dielectric elastomer is 0.4 J/g at 100% strain. For a relatively high fatigue life application such as for an engine mount, a value of 10% strain may be assumed for operation of the dielectric elastomers. Due to the linear relationship between strain and energy density, a 10% strain corresponds to 0.04 J/gram energy density. Assuming a 50% efficiency, 3 J of energy generated per movement per mount may potentially generate about 300 Watts of power per engine mount. As an average car has three engine mounts, the total energy which can be harnessed from engine vibrations can amount to about 900 Watts. This example is intended to be illustrative and not limiting. The total amount of energy generated by the devices described herein may be varied, of course, depending upon the various parameters noted.

Figure 5:
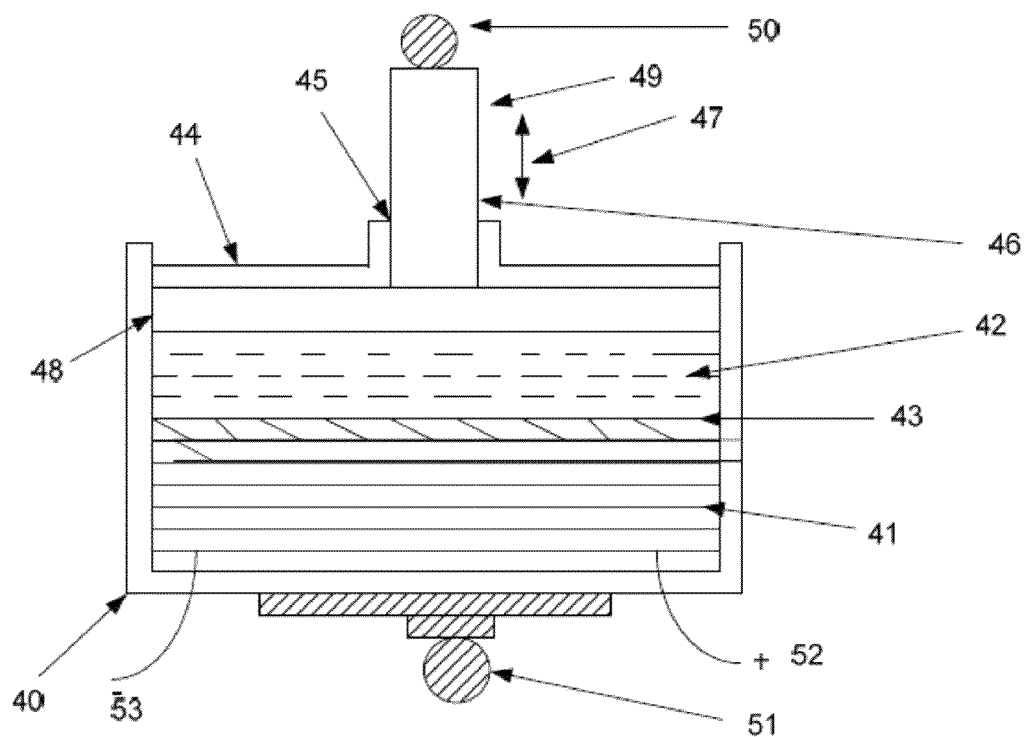
FIG. 5 shows a partial cross-sectional side view of another example of an energy generating engine mounting device.

FIG. 5 shows a design of an example of an energy generating engine mount in the cross-sectional view. The engine mount may comprise a housing 40 having one or more layers of dielectric elastomer generators 41 placed within the housing 40. These dielectric elastomer generators 41 may be stacked one above the other in this example, although the dielectric elastomer generator 41 can be configured into any of the other shapes or configurations described herein. The number of dielectric elastomer layers can also vary and may depends on the energy generation requirement.

The remaining section of the housing 40 may be filled with a viscous fluid 42 such as oil, water, etc., and an impermeable compliant membrane 43 may separate the dielectric elastomer material 41 from the fluid 42. A cover 44 having a central port 45 may be placed on top of the housing 40 and a piston or a plunger 46 can be slidingly positioned through the port 45 and sealed against the port 45. The piston 46 may be translated relative to the housing 40 as shown by the arrow 47. The piston 46 may have a disc-type distal end 48 which is closely aligned within the internal diameter of the housing 40. The proximal or the top end 49 of the piston 46 may have a proximal connector 50 for coupling the engine mount to the vibrating engine and a distal connector 51 for coupling the housing 40 to the frame of the vehicle.

Under operation of the vehicle when the engine starts operation, the engine vibrations are converted into linear oscillatory vertical motions. These motions are transmitted to the engine mount through the connection 50 which couples the engine to the piston 46. Due to the vibrations, the piston 46 may vibrate up and down causing the viscous fluid 42 to be pressurized and de-pressurized. This change in the fluid pressure may effectively cause the dielectric elastomer material 41 to stretch and contract/relax. As the dielectric material 41 stretches, electrical charges are introduced on the material 41 via the wires 52, 53 and during the contraction/relaxation of the dielectric material 41, these charges may lead to the generation of electrical energy which is also transmitted via the wires 52 and 53. The viscous fluid 42 may provide the damping energy for damping the engine vibrations.

Figure 6:
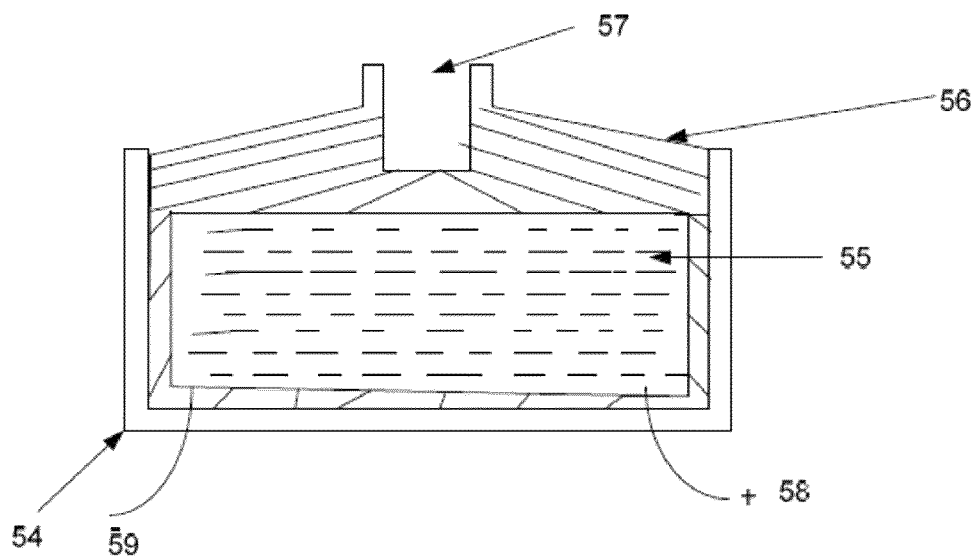
FIG. 6 shows a partial cross-sectional side view of another example of an energy generating engine mounting device.

Yet another variation is shown in the cross-sectional side view of FIG. 6 which illustrates another design of an energy generating engine mount. This engine mount may comprise a housing 54 containing a damping fluid 55 (e.g., viscous oil, water, etc) and a flexible cover 56 comprised of alternating layers of a flexible material (e.g., rubber) and dielectric elastomer material to enclose the housing 54. Flexible cover 56 may function as a flexing element and may also define a centrally mounted connector 57. The cover 56 can also extend at least partially into the housing 54 encompassing the viscous fluid 55 for additional damping. As above, the engine may be connected to the engine mount via the connector 57 such that the connector 56 is connected to the engine while the housing 54 is connected to the frame of the vehicle. A bias voltage ranging from, e.g., 0.1 kV to 10 kV or greater, may be applied to the dielectric elastomer through the wires or conductors 58 and 59. In this and other examples, the bias voltage range is exemplary and the bias voltage applied may actually range from the tens of volts to the kilovolt range in other examples depending upon various parameters such as the material configuration and design, available voltage, and/or the desired energy output, etc. During the normal operation of the car, as the engine starts vibrating the vibrations may induce an oscillatory motion on the engine mount which are transmitted through the connector 57 to cause the flexible element 56 to flex which may lead to the stretching and/or contraction/relaxation of the dielectric elastomer material. This cyclic stretching and/or contraction/relaxation of the dielectric elastomer material may cause the generation of useful electrical energy which may then be transmitted through wires or conductors 58 and 59.

Figure 7A:
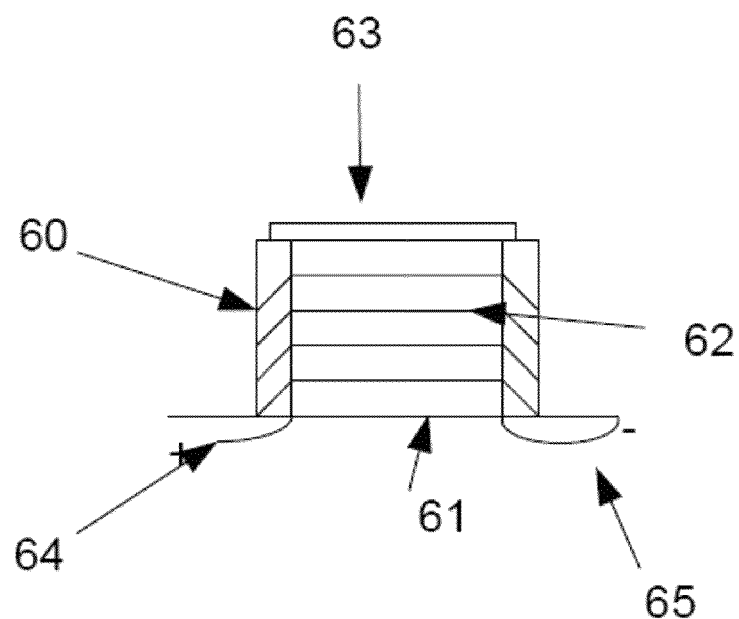
FIGS. 7A and 7B show partial cross-sectional side views of examples of energy generating battery mounting devices.
Figure 7B:
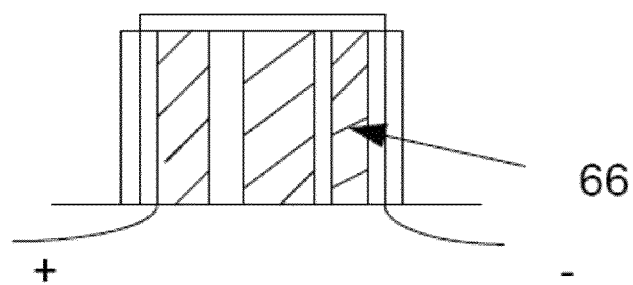

Use of dielectric elastomer energy generators is, of course, not restricted to shock absorbers or engine mounts but may also be integrated into mounts for other devices which are subjected to vibrational energy, such as batteries, seats, etc. FIG. 7A shows a cross-sectional side view of one example of a dielectric elastomer generator which may be utilized as a battery mount. The generator may comprise a housing 60 which is connected to the frame of the vehicle through any connector arrangement present at the base 61. The housing 60 may be stacked with one or more layers of dielectric elastomers 62 which can be in any number of configurations as described herein, e.g., disc, diaphragm form, etc. The top or proximal end of the housing 60 may have a connector 63 which connects the battery mount to the battery and wires or conductors 64, 65 which connect the dielectric elastomer generators to the electrical system. A bias voltage of about, e.g., 0.1 kV to 10 kV or greater, may be applied to the elastomers 62 through the wires or conductors 64, 65. In this and other examples, the bias voltage range is exemplary and the bias voltage applied may actually range from the tens of volts to the kilovolt range in other examples depending upon various parameters such as the material configuration, available voltage, and/or the desired energy output, etc. When the vibrations are generated due to the operation of the vehicle, vibrational motion of the battery may be transmitted to the dielectric elastomers 62 to cause the stretching and/or contracting/relaxing of the dielectric elastomer 62 and thus leading to the generation of electrical energy. FIG. 7B shows another embodiment of the battery mount. This variation may function similarly to the previous embodiment but may have the dielectric elastomer generators 66 in a rolled form or configuration.

Figure 8:
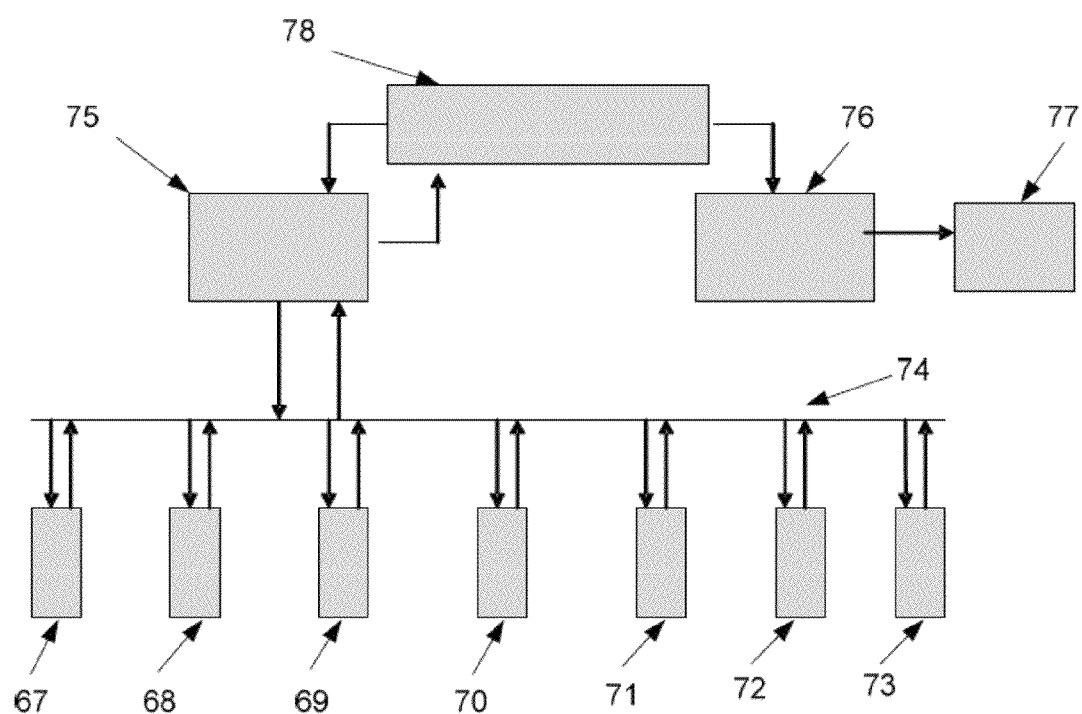
FIG. 8 show a schematic example of a composite generator system which may be incorporated in a vehicle.

As previously mentioned, a single vehicle can utilize each of the various different energy generating systems in combination to maximize the energy generation. For example, a vehicle can utilize at least four energy generating shock absorbers (for each wheel) and at least three energy generating engine mounts. Of course, other combinations may be utilized as well as the number of devices used in other examples. To effectively integrate these devices with the vehicle's electrical system for harnessing the harvested energy from these devices, an energy generation system may be integrated with the vehicle, as shown schematically in FIG. 8. In this example, individual shock absorbers may each incorporate a dielectric elastomer generator 67, 68, 69 and 70 and each engine mount may also incorporate a dielectric elastomer generator 71, 72, and 73.

Each dielectric elastomer generator may be electrically connected to a central wiring network 74. A step-up transformer 75 may be electrically connected to the central wiring network 74 for receiving the harvested energy and may also provide the biasing voltage for operating the dielectric elastomer generators. A central electronic control unit 78 (e.g., a processor) in communication with the step-up transformer 75 may control and regulate the power generated by each of the different generators as well as the biasing voltage for operating the different generators. The electronic control unit 78 has circuitry and may be programmed for monitoring the power and also for checking for any faults in the system. A step-down transformer 76 may also be in communication with the electronic control unit 78 and/or step-up transformer 75 and may also be connected to the vehicle battery 77 or to an alternate battery separate from the vehicle battery. The step-down transformer 76 may be used to convert the voltage generated by the different energy generators into a battery voltage level.

By using a generation system described above with multiple energy generating shock absorbers and engine mounts, a significant amount of energy can be generated and harvested. The harvested energy may be stored and/or used for any number of applications for which the vehicle draws power, e.g., powering the vehicle itself, accessories within the vehicle, etc. In one example, the entire energy generation system may increase the weight of a car by approximately 6 kg which corresponds to a 0.5% increase in the weight of a standard car. By way of example, an electric vehicle such as the Chevrolet Volt® (General Motors LLC, Detroit, Mich.) is estimated to travel 50 miles on a single charge of its battery. A battery normally rated at 12 kWhr for such a vehicle, approximately 1.6 kW of energy can be generated utilizing the devices and methods described herein. This increase in captured energy corresponds to approximately 13% increase in battery life which is a significant increase in the energy efficiency of the car.

Use of shock absorbers and vibration damping mounts is not restricted to vehicles but they also can be used in household appliances and other industrial applications. Household appliances such as washers, dryers and dishwashers generate mechanical vibrations during operation. This vibrational energy is dissipated as heat and noise and is wasted. Typical washers and dryers are either front loading or top loading. The rotation of the laundry mass in the rotating drum causes imbalance leading to off-axis movement of the rotating drum and leads to the generation of mechanical vibrations. With the rotational speed of the drum ranging from 400 rpm to 1400 rpm and the typical spin cycles lasting 8 minutes long, the average power consumed during that time is approximately 1 kW. This is estimated to result in about 8.54 Joules of energy being dissipated per machine. For a typical spin cycle this should amount to about 200 Watts of dissipated energy. To harvest this lost energy, existing dampers can be replaced by the dampers described herein. Also, the washing machine can be mounted on mounts similar to the battery mounts and engine mounts described above. At an energy density of 0.02 J/g, only 500 grams of dielectric elastomer material may be utilized to harness about 200 Watts of peak power.

Figure 9:
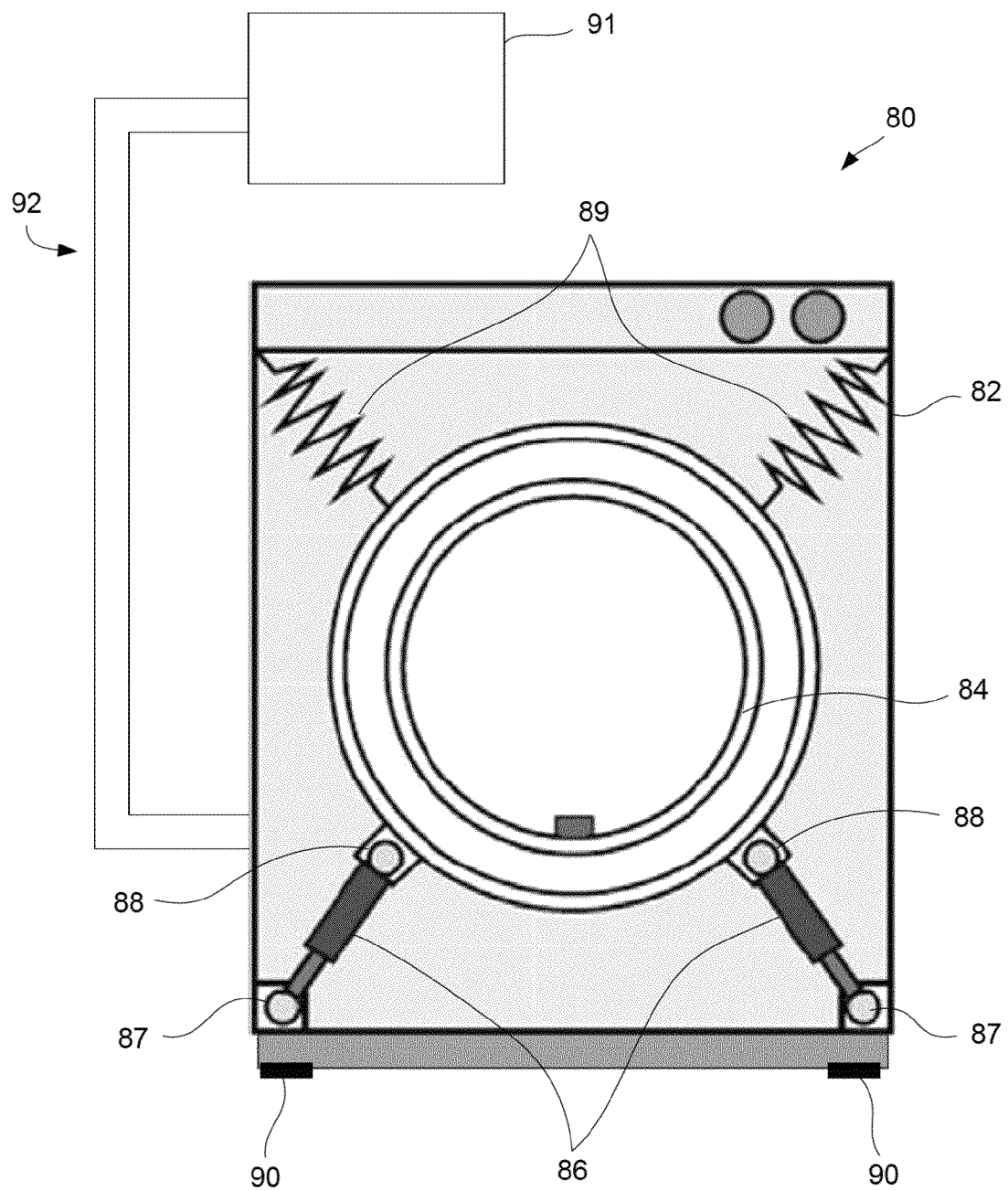
FIG. 9 shows a schematic illustration of one example of how one or more supports may capture the vibrational energy from the appliance and convert it into electrical energy for storage and/or recycling.

An example is shown in the schematic illustration of FIG. 9 in washing machine appliance 80. As shown, the housing 82 may have a drum 84 supported by springs 89 and supports 86 and which rotates during use and vibrational movement of the drum 84 may compress the one or more supports 86 to a maximum stroke length of, e.g., about 60 mm, for a given support 86 having a diameter of, e.g., about 30 mm. Each of the supports 86 may be configured to incorporate any of the dielectric elastomer generators as described herein. Moreover, each support may be coupled at mounts 87 to the appliance frame or housing 82 as well as to mounts 88 attached to the support holding the drum 84. For a drum 84 having a radius of, e.g., 25 cm, with an average estimated laundry load of e.g., 11 kg, the estimated rotational energy generated is about, e.g., 100 W at 1200 rpm. At a displacement of about 60 mm for each support 86, the amount of energy for damping the vibrations is about, e.g., 70 N. For an appliance 80, the amount of energy dissipated per support 86 results to about, e.g., 4.27 J, and the energy dissipated per appliance 80 (for two supports) is about, e.g., 8.54 J. Thus, the total amount of energy dissipated per appliance 80 for a complete spin cycle, e.g., frequency of 23.33 Hz at 1400 rpm, is about 200 W which may be harvested from appliance 80 just from the vibrational motion generated. As mentioned previously, these values are merely illustrative and may vary depending upon the number and type of supports as well as the type of appliance and length of use.

Additionally and/or alternatively, one or more mounts 90 may be placed under the appliance 80 for capturing the vibration energy from the entire appliance 80. The one or more mounts 90 may be configured as any of the dielectric elastomer generator mounts described herein. As appliance 80 converts the mechanical vibrations into electrical energy, this energy may be used to provide power to the appliance 80 resulting in a more efficient device or the energy may be supplied for use to another device or appliance. Alternatively, the energy may be harvested and stored, e.g., in an energy storage unit 91, e.g., battery, capacitor, etc., in electrical communication with the one or more supports 86 and/or mounts 90 in appliance 80 via one or more cables 92.

Although shown as incorporated into a household appliance such as a washing machine, other appliances such as dryers or dishwashing machines, etc., are readily utilized. Moreover, commercial appliances may be utilized as well such as commercial washers, dryers, machining equipment, or other commercial devices may be utilized and are intended to be within the scope of this disclosure.

The applications of the devices and methods discussed above are not limited to the vehicles and appliances but may include any number of further applications. Modification of the above-described device and methods for carrying out the invention, and variations of aspects of the invention that are obvious to those of skill in the art are intended to be within the scope of the claims.

What is claimed is:

1. An energy generating support member, comprising:
a first chamber;
a second chamber operatively movable relative to the first chamber;
one or more layers of a dielectric elastomer positioned within the second chamber; and,
a compression member attached to the first chamber and in communication with the one or more layers in the second chamber,
wherein movement between the first chamber and second chamber urges the compression member to change a pressure imparted upon or against the one or more layers such that the one or more layers generate an electric discharge in response to the change in pressure.

2. The member of claim 1 wherein the support member comprises a shock absorber.

3. The member of claim 1 wherein the second chamber comprises an attachment for coupling to an axle.

4. The member of claim 1 wherein the one or more layers of dielectric elastomers are layered in a stacked arrangement within the second chamber.

5. The member of claim 1 wherein the one or more layers of dielectric elastomers are layered about an inner wall of the second chamber.

6. The member of claim 1 further comprising a viscous fluid contained within the second chamber in communication with the one or more layers such that movement by the compression member imparts the change in pressure imparted upon or against the one or more layers by altering the pressure within the fluid.

7. The member of claim 1 further comprising one or more biasing elements positioned within the second chamber and coupled to the compression member.

8. The member of claim 1 comprising one or more wires electrically coupled to the one or more layers.

9. The member of claim 1 further comprising a step-up transformer in electrical communication with the support member.

10. The member of claim 1 further comprising a controller in communication with the support member.

11. The member of claim 1 further comprising a battery in communication with the support member.

12. The member of claim 1 further comprising a vehicle coupled to the support member.

13. The member of claim 12 wherein an engine of the vehicle is coupled to the support member.

14. The member of claim 1 wherein the first chamber comprises an attachment for coupling to is frame.

15. The member of claim 14 wherein the support member comprises a module sized for positioning between the attachment and the frame.

16. The member of claim 1 further comprising an appliance coupled to the support member.

17. The member of claim 16 wherein the support member is coupled to a motor or frame of the appliance.

18. A method of generating energy, comprising:
receiving one or more vibrations in a vehicle;
imparting a movement between a first chamber and a second chamber operatively movable relative to the first chamber in response to the one or more vibrations;
urging a compression member attached to the first chamber to change a pressure imparted upon or against one or more layers of a dielectric elastomer positioned within the second chamber; and,
generating art electric discharge from the one or more layers in response to the change in pressure.

19. The method of claim 18 wherein receiving comprises receiving the one or more vibrations in response to moving the vehicle upon a road surface.

20. The method of claim 18 wherein receiving comprises receiving the one or more vibrations in response to vibrations received from an engine coupled to the vehicle.

21. The method of claim 18 wherein receiving comprises receiving the one or more vibrations in response to vibrations received from a frame of the vehicle.

22. The method of claim 18 wherein urging a compression member comprises urging a plunger upon or against the one or more layers.

23. The method of claim 18 wherein urging a compression member comprises urging a plunger within a volume of fluid contained within the second chamber such that movement of the plunger imparts the change in pressure in the fluid upon or against the one or more layers.

24. The method of claim 18 further comprising applying a bias voltage of 0.1 kV to 10 kV to the one or more layers prior to generating an electric discharge.

25. The method of claim 18 further comprising conducting the electric discharge from the one or more layers to a battery.

26. The method of claim 25 further comprising controlling the one or more layers via a controller.

27. An energy generating support mount, comprising:
a housing having a first surface coupled to a vibrating mass; and,
one or more layers of a dielectric elastomer positioned within the housing,
wherein vibrational movement of the mass against the first surface changes a pressure imparted upon or against the one or more layers such that the one or more layers generate an electric discharge in response to the change in pressure, and
wherein the support mount comprises a module sized for positioning between the mass and a frame.

28. The mount of claim 27 wherein the first surface comprises an attachment for coupling to the mass.

29. The mount of claim 27 wherein the housing comprises a flexible covering incorporating the one or more layers.

30. The mount of claim 27 further comprising a viscous fluid contained within the housing in communication with the one or more layers such that movement of the mass imparts the change in pressure imparted upon or against the one or more layers by altering the pressure within the fluid.

31. The mount of claim 27 wherein the one or more layers of dielectric elastomer are layered in a stacked arrangement within the housing.

32. The mount of claim 27 comprising one or more wires electrically coupled to the one or more layers.

33. The mount of claim 27 further comprising a step-up transformer in electrical communication with the support mount.

34. The mount of claim 27 further comprising a controller in communication with the support mount.

35. The mount of claim 27 further comprising a battery in communication with the support mount.

36. The mount of claim 27 further comprising a vehicle coupled to the support mount.

37. The mount of claim 27 further comprising an appliance coupled to the support mount.

38. The member of claim 37 wherein the support mount is coupled to a motor or frame of the appliance.

39. A method of generating energy, comprising:
securing a mass to one or more support mounts within a vehicle;
imparting a movement to the mass in response to one or more vibrations in response to moving the vehicle upon a road surface such that the mass imparts a change in pressure upon or against a first surface of each of the one or more support mounts; and,
generating an electric discharge from one or more layers of a dielectric elastomer positioned within each of the one or more support mounts in response to the change in pressure.

40. The method of claim 39 wherein securing a mass comprises securing a battery to the one or more support mounts within the vehicle.

41. The method of claim 39 wherein securing a mass comprises securing a shock absorber to a frame of the vehicle such that the mounts are positioned therebetween.

42. The method of claim 39 further comprising conducting the electric discharge from the one or more layers to a battery.

43. The method of claim 39 further comprising controlling the one or more layers via a controller.

44. The method of claim 39 further comprising applying a bias voltage of 0.1 to 10 kV to the one or more layers prior to generating an electric discharge.

45. The method of claim 39 wherein securing a mass comprises securing an engine to the one or more support mounts against a frame of the vehicle.

46. The method of claim 45 wherein imparting comprises imparting the movement from the one or more vibrations in response to engine operation.

47. A method of generating energy, comprising:
securing a mass comprising a rotatable drum to one or more support mounts within an appliance;
imparting a movement to the mass in response to one or more vibrations such that the mass imparts a change in pressure upon or against a first surface of each of the one or more support mounts; and,
generating an electric discharge from one or more layers of a dielectric elastomer positioned within each of the one or more support mounts in response to the change in pressure.

48. The method of claim 47 further comprising conducting the electric discharge from the one or more layers to a battery.

49. The method of claim 47 further comprising controlling the one or more layers via a controller.

50. The method of claim 47 further comprising applying a bias voltage of 0.1 kV to 10 kV to the one or more layers prior to generating an electric discharge.

51. The method of claim 47 wherein imparting comprises imparting the movement from the one or more vibrations in response to rotating the drum within the appliance.

52. The method of claim 51 wherein securing a mass comprises securing a motor or frame to the one or more support mounts.

* * * * *